United States Patent [19]
Heyder et al.

[11] Patent Number: 6,034,000
[45] Date of Patent: Mar. 7, 2000

[54] MULTIPLE LOADLOCK SYSTEM

[75] Inventors: Roger V. Heyder, Los Altos; Thomas B. Brezocsky, San Jose; Robert E. Davenport, Los Gatos, all of Calif.

[73] Assignee: Applied Materials, Inc., Santa Clara, Calif.

[21] Appl. No.: 08/901,485

[22] Filed: Jul. 28, 1997

[51] Int. Cl.⁷ .......................... H01L 21/31; H01L 21/469
[52] U.S. Cl. .......................... 438/907; 438/908; 438/758
[58] Field of Search ...................................... 438/908, 907

[56] References Cited

U.S. PATENT DOCUMENTS

| | | |
|---|---|---|
| 4,178,113 | 12/1979 | Beaver, II et al. . |
| 4,693,777 | 9/1987 | Hazano et al. . |
| 4,759,681 | 7/1988 | Nogami . |
| 4,785,962 | 11/1988 | Toshima . |
| 4,801,241 | 1/1989 | Zajac et al. . |
| 4,828,224 | 5/1989 | Crabb et al. . |
| 4,836,733 | 6/1989 | Hertel et al. . |
| 4,863,547 | 9/1989 | Shidahara et al. . |
| 4,923,584 | 5/1990 | Bromhall, Jr. et al. . |
| 4,951,601 | 8/1990 | Maydan et al. . |
| 4,952,299 | 8/1990 | Chrisos et al. . |
| 4,990,047 | 2/1991 | Wagner . |
| 5,131,460 | 7/1992 | Kreuger . |
| 5,186,718 | 2/1993 | Tepman et al. . |
| 5,227,708 | 7/1993 | Lowrance . |
| 5,254,170 | 10/1993 | Devilbiss et al. . |
| 5,261,935 | 11/1993 | Ishii et al. . |
| 5,292,393 | 3/1994 | Maydan et al. . |
| 5,443,346 | 8/1995 | Murata et al. . |
| 5,447,409 | 9/1995 | Grunes et al. . |
| 5,464,313 | 11/1995 | Ohsawa . |
| 5,516,732 | 5/1996 | Flegal . |
| 5,570,994 | 11/1996 | Somekh et al. . |
| 5,611,655 | 3/1997 | Fukasawa et al. . |
| 5,615,988 | 4/1997 | Wiesler et al. . |
| 5,655,277 | 8/1997 | Galdos et al. . |
| 5,770,590 | 9/1988 | Hughes et al. . |

FOREIGN PATENT DOCUMENTS

| | | |
|---|---|---|
| 28933 | 1/1989 | Japan . |
| 98848 | 3/1989 | Japan . |
| 13551 | 1/1993 | Japan . |
| 6104326 | 4/1994 | Japan . |
| 156624 | 6/1994 | Japan . |

OTHER PUBLICATIONS

U.S. application serial No. 08/627,532, filed 4, 1996 (1057/PVD/DV).
Declaration of Thomas B. Brezocsky.
U.S. Patent Application Serial No. 08/627,532, filed Apr. 4, 1996 (Atty. Dkt. 1057/PVD/Dv.
U.S. Patent Application Serial No. 08/610,708, filed Mar. 4, 1996, (Atty. Dkt. 1063/MD/PVD/DV).
"Dry Etching Systems: Gearing Up for Larger Wafers", *Semiconductor International Magazine*, pp. 48–60, Oct. 1985.

*Primary Examiner*—John F. Niebling
*Assistant Examiner*—Josetta I. Jones
*Attorney, Agent, or Firm*—Konrad, Raynes & Victor

[57] ABSTRACT

A semiconductor processing system having a holding chamber coupled to a mainframe processing system and at least one loadlock chamber coupled to the holding chamber in which unprocessed wafers are transferred from the loadlock chamber to the holding chamber for subsequent processing by the mainframe system.

19 Claims, 12 Drawing Sheets

| CYCLE | EXIT LOAD LOCK | ENTRY LOAD LOCK | CENTRAL HOLDING | MAINFRAME |
|---|---|---|---|---|
| Initial conditions at start of cycle 1: | Cassettes are empty | Cassettes are full of unprocessed wafers | Lot transfer robots are empty | Processing chambers empty |
| Cycle 1: | — | Unprocessed wafer sublot unloaded from each cassette | Takes two wafer sublots from entry loadlock for processing | Processes and returns both wafer sublots to central holding chamber |
|  |  | Vent, reload and pump down both cassettes |  |  |
| Cycle 2: | Unprocessed wafer sublot loaded into each cassette | Unprocessed wafer sublot unloaded from each cassette | Transfers two processed wafer sublots to exit loadlocks and takes two more unprocessed wafer sublots from entry loadlock for processing | Processes and returns both wafer sublots to central holding chamber |
|  | Vent, unload and pump down both cassettes | Vent, reload and pump down both cassettes |  |  |

| Fig. 7A |
|---|
| Fig. 7B |

| | | | |
|---|---|---|---|
| Cycle 3: | Processed wafer sublot loaded into each cassette | Unprocessed wafer sublot unloaded from each cassette | Transfers two processed wafer sublots to exit loadlocks and takes two more wafer sublots for processing | Processes and returns both wafer sublots to central holding chamber |
| | Vent, unload and pump down both cassettes | Vent, reload and pump down both cassettes | | |
| Cycle 4: | Processed wafer sublot loaded into each cassette | Unprocessed wafer sublot unloaded from each cassette | Transfers two processed wafer sublots to exit loadlocks and takes two more unprocessed wafer sublots from entry loadlock for processing | Processes and returns both wafer sublots to central holding chamber |
| | Vent, unload and pump down both cassettes | Vent, reload and pump down both cassettes | | |
| Cycle 5: | Processed wafer sublot loaded into each cassette | Unprocessed wafer sublot unloaded from each cassette | Transfers two processed wafer sublots to exit loadlocks and takes two more wafer sublots for processing | Processes and returns both wafer sublots to central holding chamber |
| | Vent, unload and pump down both cassettes | Vent, reload and pump down both cassettes | | |

Fig. 7B

| CYCLE | EXIT LOAD LOCK | ENTRY LOAD LOCK | CENTRAL HOLDING | MAINFRAME |
|---|---|---|---|---|
| Initial conditions at start of cycle 1: | Cassettes are empty | Cassettes are full of unprocessed wafers | Lot transfer robots are empty | Processing chambers empty |
| Cycle 1: | — | Unprocessed wafer sublot unloaded from each cassette | Takes two wafer sublots from entry loadlock for processing | Processes and returns both wafer sublots to central holding chamber |
| Cycle 2: | Unprocessed wafer sublot loaded into each cassette | Unprocessed wafer sublot unloaded from each cassette | Transfers two processed wafer sublots to exit loadlocks and takes two more unprocessed wafer sublots from entry loadlock for processing | Processes and returns both wafer sublots to central holding chamber |
|  |  | Vent, reload and pump down both cassettes |  |  |

Fig. 8A

| Fig. 8A |
|---|
| Fig. 8B |

Fig. 8

| | | | |
|---|---|---|---|
| Cycle 3: | Processed wafer sublot loaded into each cassette | Unprocessed wafer sublot unloaded from each cassette | Transfers two processed wafer sublots to exit loadlocks and takes two more wafer sublots for processing | Processes and returns both wafer sublots to central holding chamber |
| | Vent, unload and pump down both cassettes | | | |
| Cycle 4: | Processed wafer sublot loaded into each cassette | Unprocessed wafer sublot unloaded from each cassette | Transfers two processed wafer sublots to exit loadlocks and takes two more unprocessed wafer sublots from entry loadlock for processing | Processes and returns both wafer sublots to central holding chamber |
| | Vent, reload and pump down both cassettes | | | |
| Cycle 5: | Processed wafer sublot loaded into each cassette | Unprocessed wafer sublot unloaded from each cassette | Transfers two processed wafer sublots to exit loadlocks and takes two more wafer sublots for processing | Processes and returns both wafer sublots to central holding chamber |
| | Vent, unload and pump down both cassettes | | | |

Fig. 8B

| CYCLE | LOAD LOCK A | LOAD LOCK B | CENTRAL HOLDING | MAINFRAME |
|---|---|---|---|---|
| Initial conditions at start of cycle 1: | Cassettes are full of processed wafers | Cassettes are full of processed wafers | Lot transfer robots are empty | Processing chambers empty |
| Cycle 1: | Vent, unload processed wafers, reload with unprocessed wafers and pump down both cassettes | Unprocessed wafer lot unloaded from each cassette | Takes two wafer lots from loadlock B for processing | Processes and returns both wafer lots to central holding chamber |
| Cycle 2: | Unprocessed wafer lot unloaded from each cassette | Vent, unload processed wafers, reload with unprocessed wafers and pump down both cassettes | Transfers two processed wafer lots to loadlock B and takes two more unprocessed wafer lots from loadlock A for processing | Processes and returns both wafer lots to central holding chamber |

Fig. 9A

| Fig. 9 | Fig. 9A |
|---|---|
| | Fig. 9B |

|  | | | |
|---|---|---|---|
| Cycle 3: | Receives two processed wafer lots from central holding chamber | Unprocessed wafer lot unloaded from each cassette | Transfers two processed wafer lots to loadlock A and takes two more unprocessed wafer lots from loadlock B for processing | Processes and returns both wafer lots to central holding chamber |
| | Vent, unload processed wafers, reload with unprocessed wafers and pump down both cassettes | | | |
| Cycle 4: | Unprocessed wafer lot unloaded from each cassette | Receives two processed wafer lots from central holding chamber | Transfers two processed wafer lots to loadlock B and takes two more unprocessed wafer lots from loadlock A for processing | Processes and returns both wafer lots to central holding chamber |
| | | Vent, unload processed wafers, reload with unprocessed wafers and pump down both cassettes | | |

Fig. 9B

MULTIPLE LOADLOCK SYSTEM

BACKGROUND OF THE INVENTION

The present invention relates to semiconductor processing systems, and more particularly, to semiconductor processing systems having removable cassettes for holding processed and unprocessed workpieces.

In order to decrease contamination and to enhance throughput, semiconductor processing systems often utilize one or more robots to transfer semiconductor wafers, substrates and other workpieces between a number of different vacuum chambers which perform a variety of tasks. An article entitled "Dry Etching Systems: Gearing Up for Larger Wafers", in the October, 1985 issue of Semiconductor International magazine, pages 48–60, describes a four-chamber dry etching system in which a robot housed in a pentagonal-shaped mainframe serves four plasma etching chambers and a loadlock chamber mounted on the robot housing. FIG. 1 of the present application illustrates a typical loadlock chamber 10 having a cassette 12 for holding unprocessed wafers 13 to be unloaded by a robot 14 and transferred to various processing chambers (not shown) attached to a mainframe 16.

The loadlock chamber 10 is a pressure-tight enclosure which is coupled to the periphery of the mainframe 16 by interlocking seals 18 which permit the loadlock chamber to be removed and reattached to the mainframe as needed. The cassette 12 is loaded into the loadlock chamber 10 through a rear door (not shown) which is closed in a pressure-tight seal. The wafers are transferred between the mainframe 16 and the loadlock chamber 10 through a passageway 20 which may be closed by a slit valve 22.

Although only eight wafers are illustrated for purposes of clarity, a typical cassette 12 may be initially loaded with as many as 25 or more unprocessed wafers 13 or other workpieces before the cassette is loaded into the loadlock chamber 10. After the loadlock access door is closed and sealed, the loadlock chamber is then pumped by a pump system (not shown) down to the vacuum level of the mainframe 16 before the slit valve 22 is opened. The robot 14 which is mounted in the mainframe 16 then unloads the wafers from the cassette one at a time, transferring each wafer in turn to the first processing chamber. As best seen in FIG. 2, the robot 14 includes a robot hand or blade 24 which is moved underneath the wafer 13 to be unloaded. The robot 14 then "lifts" the wafer 13 from the wafer supports 26 supporting the wafers 13 in the cassette 12. By "lifting," it is meant that either the robot blade 24 is elevated or the cassette 12 is lowered by a suitable lifting mechanism 30 such that the wafer 13 is lifted off the cassette wafer supports 26. The wafer may then be withdrawn from the cassette 12 through the passageway 20 and transferred to the first processing chamber.

Once a wafer has completed its processing in the first processing chamber, that wafer is transferred to the next processing chamber and the robot 14 unloads another wafer from the cassette 12 and transfers it to the first processing chamber. When a wafer has completed all the processing steps of the wafer processing system, the robot 14 typically returns the processed wafer back to the cassette 12 from which it came. Once all the wafers have been processed and returned to the cassette 12, the cassette in the loadlock chamber is removed and another full cassette of unprocessed wafers is reloaded.

One problem associated with systems having single loadlock chamber and cassette is that the robot will run out of unprocessed wafers to unload before all the wafers are processed and returned to the cassette. Processing chambers will become idle as the last wafer works its way through the system. The time necessary for each wafer to pass through each of the processing chambers and to return to the cassette depends upon the number of processing chambers in the system and the time required for each processing step. Some systems have as many as 10 processing chambers in which each processing step can take 2 minutes or more. Thus, in some systems it can take 20 minutes or longer for the last wafer to return to the cassette, during which time the processing of additional wafers is halted.

Furthermore, once the cassette has been filled with the processed wafers, it is necessary to vent the loadlock chamber, remove the old cassette and insert a cassette of unprocessed wafers into the loadlock and then pump down the loadlock chamber to the vacuum level of the robot chamber. Although the increased vacuum isolation provided by such systems can improve product quality, it has been difficult to achieve commercially acceptable throughput for high vacuum processes, such as, for example, physical vapor processes such as sputtering. The time required to pump down the loadlock chambers to the base level, following loading of a cassette of wafers into the loadlock chamber, can be excessive.

In order to increase throughput, it has been proposed to utilize two loadlock chambers as described in U.S. Pat. No. 5,186,718 which is incorporated in its entirety by reference. In such a two loadlock system, both loadlock chambers are loaded with full cassettes of unprocessed wafers. FIG. 3 of the present application illustrates in time line form several processing cycles for such a two loadlock system 100 (FIG. 4) having a mainframe 116 to which a plurality of processing chamber 140 are coupled. As shown in FIG. 3, the robot 14 starts unloading unprocessed wafers from the first loadlock chamber A ("L.L.A."). Following a certain delay, the first wafer will have completed processing by the system 100. At that time, it is believed that the robot typically loads the first processed wafer back into the cassette of loadlock chamber A, the same cassette from which it was unloaded. This process continues until the robot completes unloading the unprocessed wafers from the cassette of loadlock chamber A. However, because the system has two loadlock chambers, the processing chambers are not idled as the last wafer from loadlock chamber A passes through the system. Instead, once the supply of unprocessed wafers from loadlock chamber A is exhausted, the robot begins to unload unprocessed wafers from loadlock chamber B to start another unloadload cycle (cycle 2) as shown in FIG. 3. As the processing of individual wafers is completed, the robot continues to return processed wafers to the cassette of loadlock chamber A until the loadlock chamber A cassette is filled with processed wafers (completing unload-load cycle 1). At that time, the next processed wafer (the first wafer unloaded from loadlock chamber B) will be returned to the cassette of loadlock B from which it was unloaded.

As the robot unloads unprocessed wafers from the cassette of loadlock chamber B and returns processed wafers to the cassette of loadlock chamber B, the slit valve to loadlock chamber A may be closed to permit the loadlock chamber A to be vented and the cassette removed and replaced with a cassette of unprocessed wafers. Once loadlock chamber A has been pumped back down to the base vacuum level and the robot unloads the last unprocessed wafer from loadlock chamber B, the robot can resume unloading unprocessed wafers from the cassette of loadlock chamber A, initiating a third unload-load cycle (cycle 3). Thus, if the loadlock chamber A with the new cassette of unprocessed wafers can be pumped down before the robot finishes unloading the cassette of loadlock chamber B, processing of wafers can be continued uninterrupted.

When the robot has finished loading processed wafers into the cassette of loadlock chamber B ending unload-load cycle 2, the cassette in loadlock chamber B can be removed and replaced with a full cassette of unprocessed wafers. In the meantime the robot continues to unload unprocessed wafers from and load processed wafers into the cassette of loadlock chamber A. In this manner, wafer processing can be maintained more continuously, significantly increasing throughput over the single loadlock systems.

However, it has now been proposed to process two wafers at a time at a particular station to further increase throughput. Such systems would be similar to the system described above but in general the number of processing chambers at each station would be doubled so that two wafers could be processed simultaneously at that station. In addition, the transfer robot may have two parallel sets of wafer blades to enable two wafers to be transferred simultaneously. To take advantage of the increased throughput potential of such a double wafer system, the number of cassettes in the loadlock chambers could be doubled as well. However, to accommodate two cassettes instead of one cassette, it would be necessary to substantially increase the size of each loadlock chamber to as much as double its present size. Coupling two such double size loadlock chambers to the processing system would occupy valuable space that could otherwise be used for processing chambers.

SUMMARY OF THE INVENTION

It is an object of the present invention to provide a workpiece loading and unloading system obviating for practical purposes, the above-mentioned limitations, particularly in a manner requiring a relatively uncomplicated electromechanical arrangement.

These and other objects and advantages are achieved in a semiconductor processing system which in accordance with one aspect of the present invention, includes a mainframe having a plurality of processing chambers, at least one workpiece loadlock chamber, and a holding chamber coupled between the processing system mainframe and the loadlock chambers. As explained in greater detail below, coupling the loadlock chambers to an intermediate holding chamber rather than directly to the processing system mainframe can substantially increase the number of cassettes which can be accommodated by the loadlock chambers without substantially increasing the amount of mainframe periphery occupied by the loadlock chambers.

In the illustrated embodiment, a central loadlock chamber having two internal lot transfer robots, is coupled directly to the periphery of the processing system mainframe. An entry loadlock chamber having two cassettes of unprocessed wafers is coupled to the opposite side of the central loadlock chamber through a slit valve for unloading wafers. The cassette may hold a full lot of wafers at a time or a "sublot" which is used herein to discuss a portion of a full lot. When the slit valve is opened, the two lot transfer robots of the central loadlock unload two lots or sublots of wafers from the entry chamber cassettes through the unloading slit valve and hold them for subsequent unloading and processing by a mainframe robot and the mainframe processing chambers.

Also coupled to the central loadlock chamber are a pair of exit loadlock chambers positioned at two ends, respectively, of the central loadlock chamber. Once the two sublots of wafers have been fully processed by the system, wafer loading slit valves to the two exit chambers are opened and the two processed sublots are transferred through the two wafer loading slit valves to the cassettes of the two exit chambers, respectively, by the central loadlock chamber lot transfer robots. Because the entry and exit loadlock chambers are coupled to the system mainframe though the central loadlock chamber, the periphery of the system mainframe is in effect extended so as to increase the periphery to which loadlock chambers can be coupled. As a result, in the illustrated embodiment, four cassettes, are coupled to the system mainframe through the space that previously could accommodate only two cassettes.

Once all of the wafers has been unloaded from each of the two entry chamber cassettes, the wafer unloading slit valve between the central loadlock chamber and the entry loadlock chamber can be closed to permit the entry loadlock chamber to be vented to atmosphere. While wafers being held in the central loadlock chamber are being processed, the two entry chamber cassettes can be reloaded through additional slit valves in the entry chamber, with more unprocessed wafers, preferably by additional robots. After the two entry chamber cassettes are loaded with additional unprocessed wafers, the wafer loading slit valves are closed and the entry chamber is pumped down to the vacuum level of the central loadlock chamber to permit the unprocessed wafers to be subsequently transferred to the central loadlock chamber.

In a similar fashion, once the two exit chamber cassettes have been loaded with processed wafers, the wafer loading slit valves between the exit chambers and the central loadlock chamber can be closed to permit the exit loadlock chambers to be vented to atmosphere. Again, one or more robots may be used to unload the processed wafers from the exit chambers. After the two exit chamber cassettes are fully unloaded, the unloading slit valves may be closed and the exit chambers pumped down to the vacuum level of the central loadlock chamber. In this manner, the entry and exit chambers may be alternately vented and pumped down independently of each other and also the central loadlock chamber to facilitate a high throughput.

BRIEF DESCRIPTION OF THE DRAWINGS

FIGS. 7A and 7B when combined as indicated in composite FIG. 7 are a chart depicting several unload and load cycles of the wafer processing system of FIG. 5. alternative embodiment.

FIGS. 8A and 8B when combined as indicated in composite FIG. 8 are a chart depicting several unload and load cycles in accordance with an alternative embodiment.

FIGS. 9A and 9B when combined as indicated in composite FIG. 9 are a chart depicting several unload and load cycles in accordance with yet another alternative embodiment.

DETAILED DESCRIPTION OF THE DRAWINGS

Figure 1:
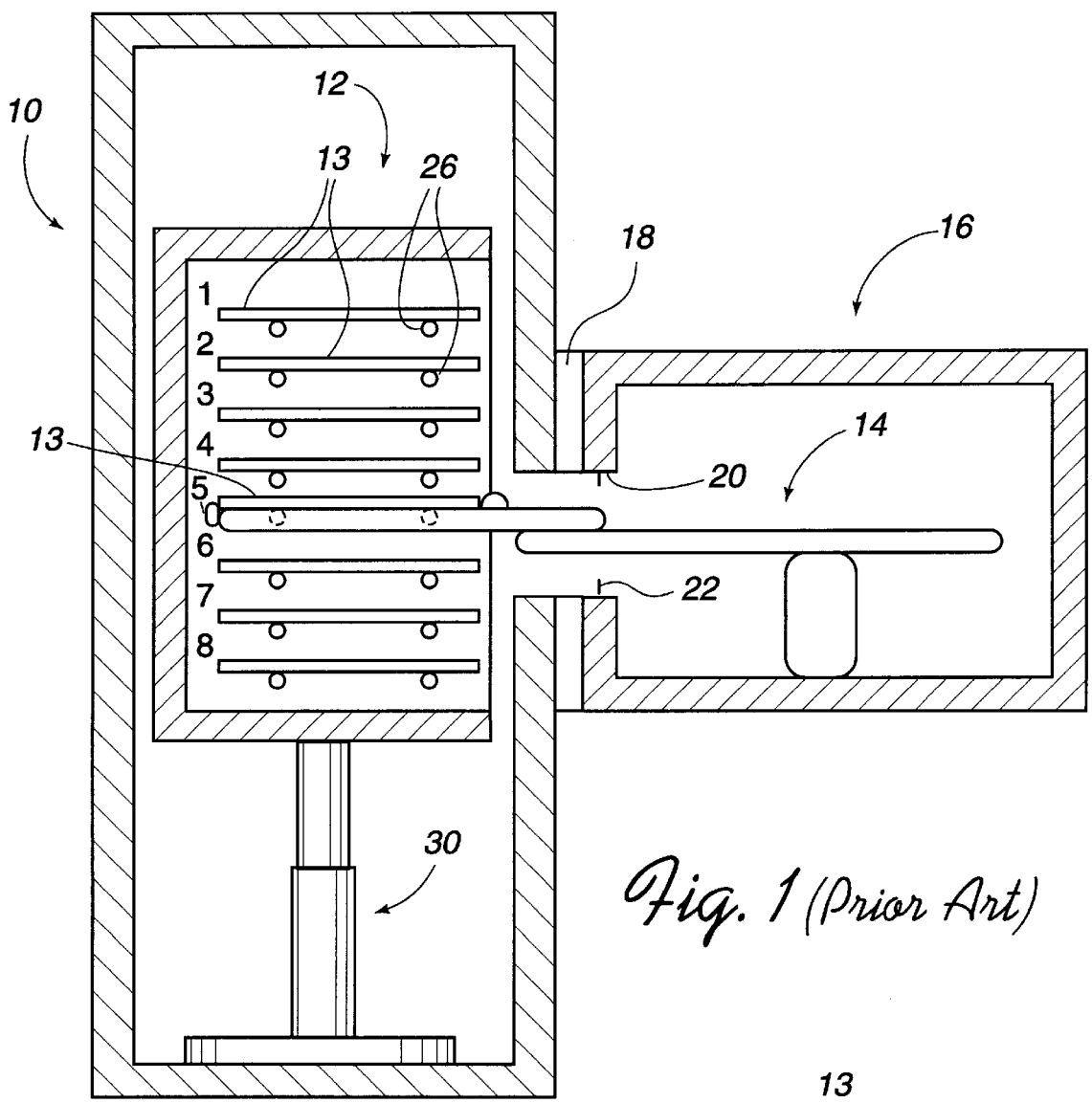
FIG. 1 is a partial cross-sectional view of a prior art loadlock chamber and robot chamber.
Figure 2:
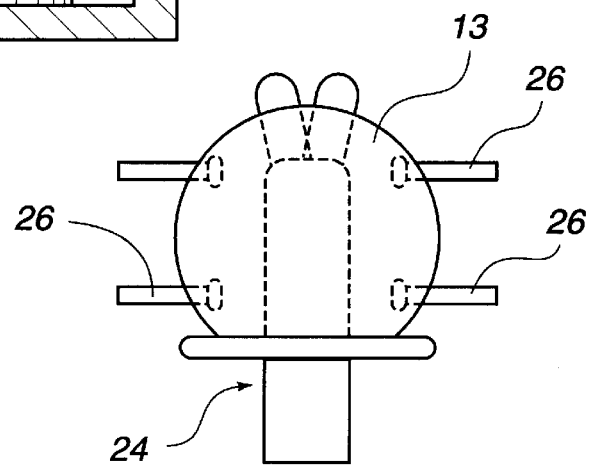
FIG. 2 is a top view of the robot blade of FIG. 1 illustrated holding a wafer.
Figure 3:
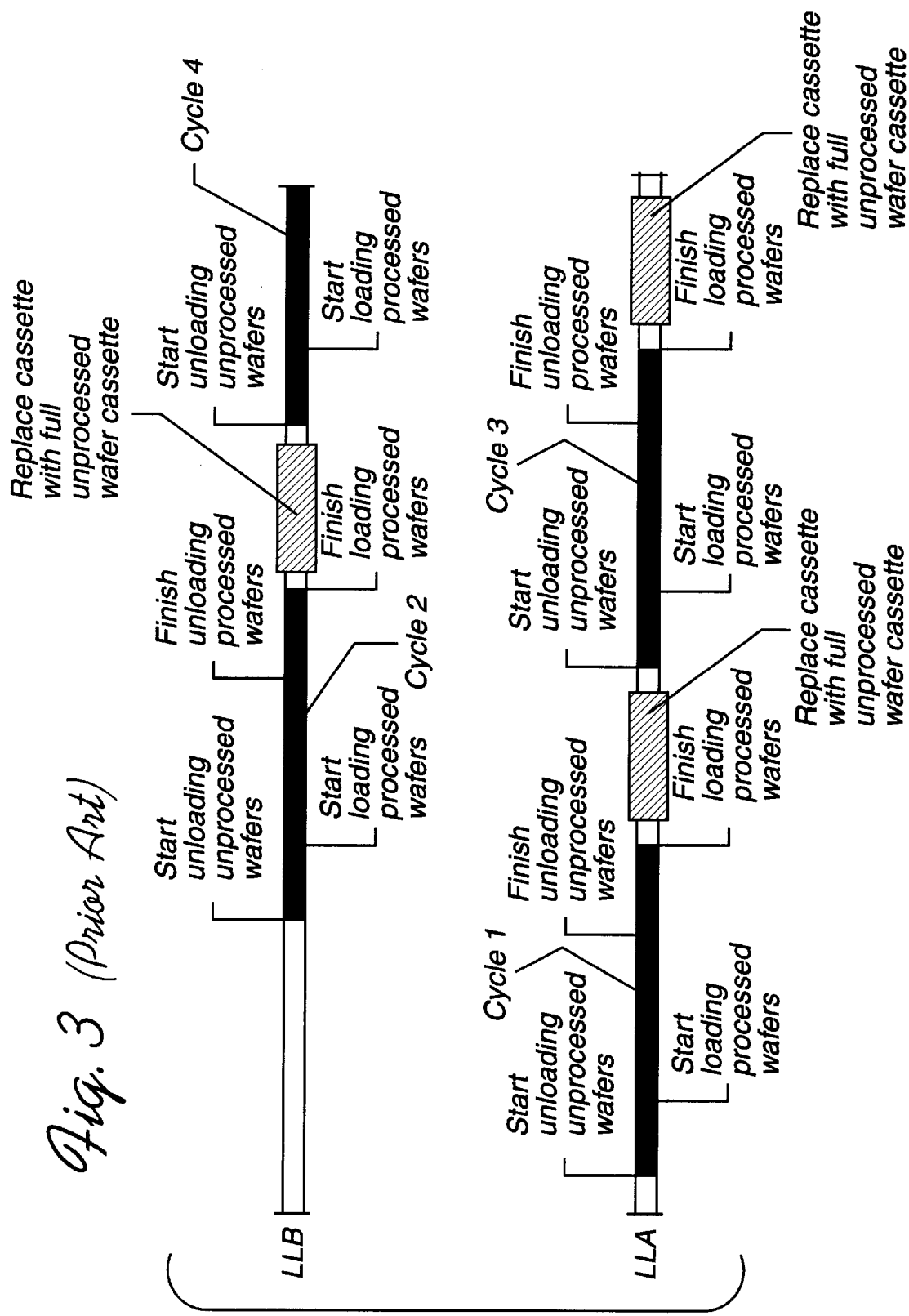
FIG. 3 is time line indicating unload and loading cycles of a prior art two loadlock system.
Figure 4:
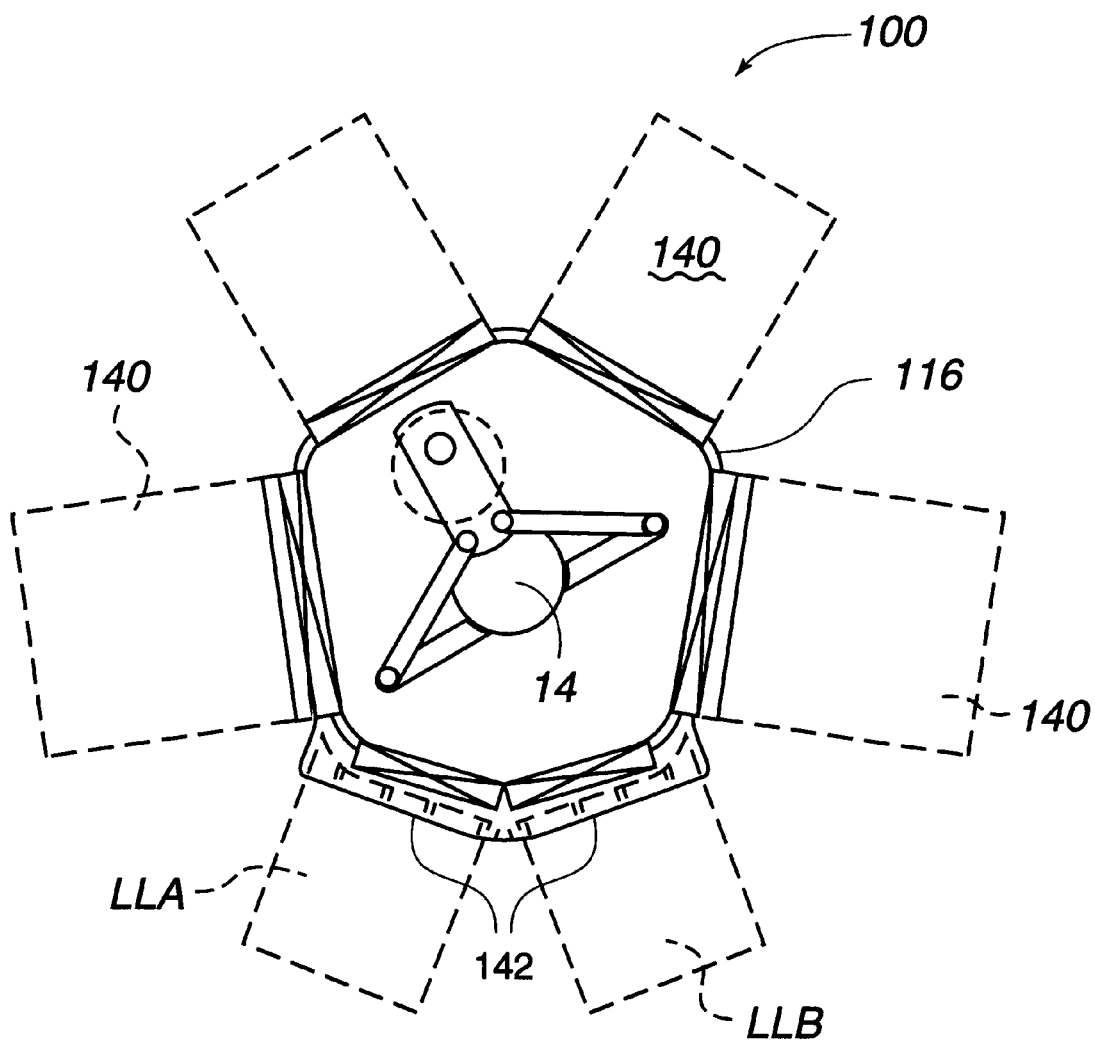
FIG. 4 is a schematic top view of a prior art two loadlock wafer processing system.
Figure 5:
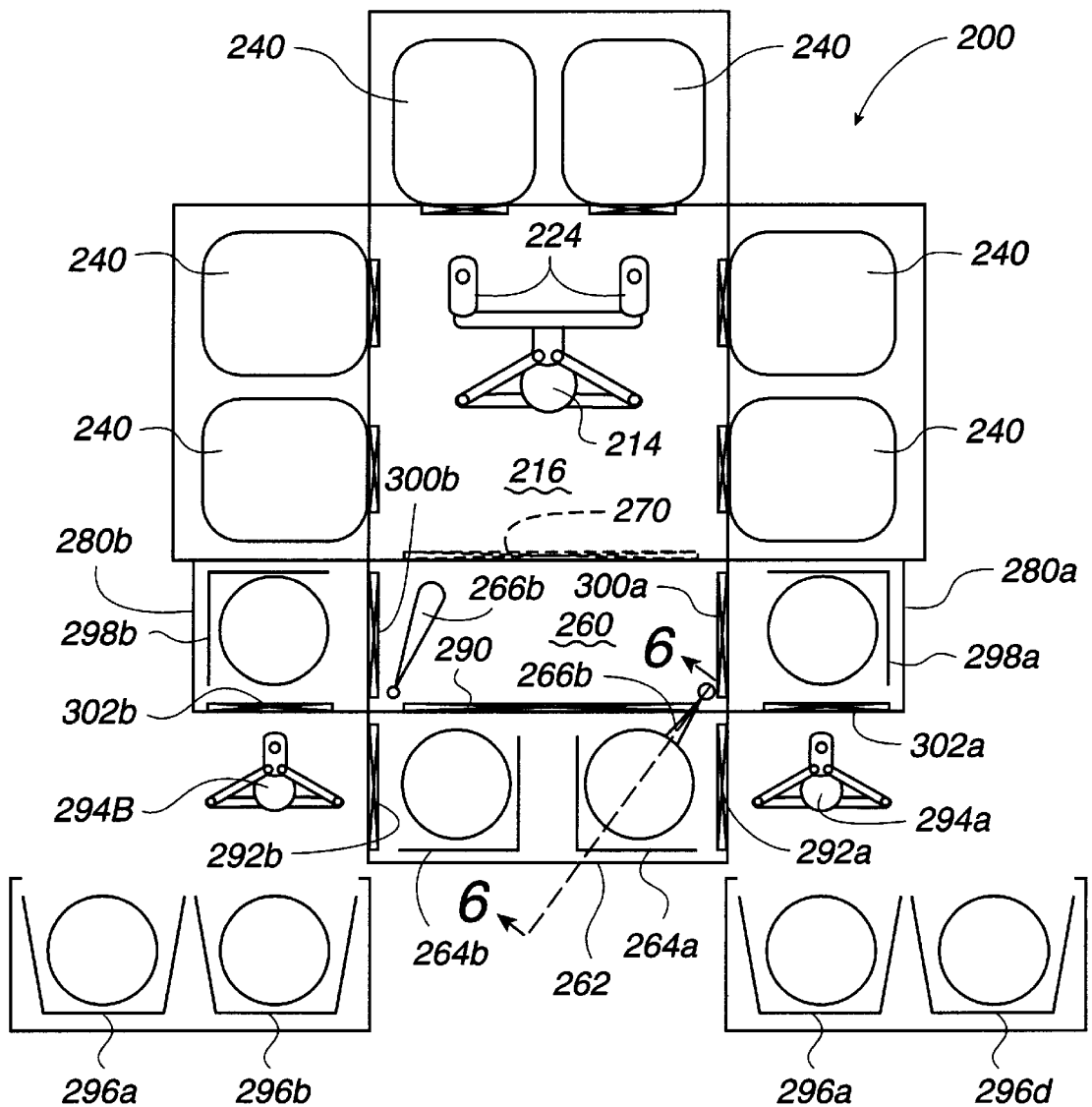
FIG. 5 is a schematic top view of a wafer processing system in accordance with a preferred embodiment of the present invention.

A wafer processing system in accordance with a preferred embodiment of the present invention is indicated generally at 200 in FIG. 5. The system 200 includes a mainframe transfer robot 214 positioned in a mainframe 216 to which are coupled a plurality of processing chambers 240 arranged in pairs. The transfer robot 214 has two parallel robot blades 224 for transferring two wafers at a time into (or from) each pair of adjacent processing chambers 240. The processing chambers 240 may include a variety of different types of processing chambers including etch and deposition chambers as well as preprocessing and post processing chambers or stations for heating, cooling, orienting and cleaning wafers before and after processing. Because two wafers can be transferred at a time, adjacent pairs of processing chambers can be selected which perform the same process simultaneously on each pair of wafers.

In accordance with one aspect of the present invention, the system 200 has a central holding chamber 260 coupled to the periphery of the mainframe 216. The holding chamber 260 receives unprocessed wafers from a loadlock chamber 262 which is coupled to the other side of the holding chamber 260 instead of directly to the mainframe 216. (Wafers or other workpieces not yet processed by the processing chambers of the mainframe 216 are referred to herein as "unprocessed" workpieces although it is contemplated that such workpieces may have been processed by other apparatus prior to being loaded into the chamber 262 for subsequent processing by the mainframe 216.) The loadlock chamber 262, designated the "entry" loadlock chamber, has a pair of cassettes 264a and 264b which support two stacks of unprocessed wafers. In the illustrated embodiment, each stack of wafers held in the cassettes 264a and 264b is a portion of a lot, which portion is referred to herein as a "sublot." It is recognized of course that in alternative embodiments, the number of wafers held by the each of the cassettes of the entry chambers may vary, depending upon the particular application. For example, the cassettes may hold an entire lot or a plurality of lots or a plurality of sublots, depending upon the size of the lots and the throughput of the system.

The entry loadlock chamber 262 may be used to perform certain preprocessing steps such as outgassing the wafers after the loadlock chamber 262 has been pumped down. Thus, the chamber 262 may have heat lamps or hot gas outlets for directing a stream of hot gas such as argon onto the wafers to heat them so as to drive out gases and moisture previously absorbed by the wafers when exposed to the atmosphere.

Figure 6A:
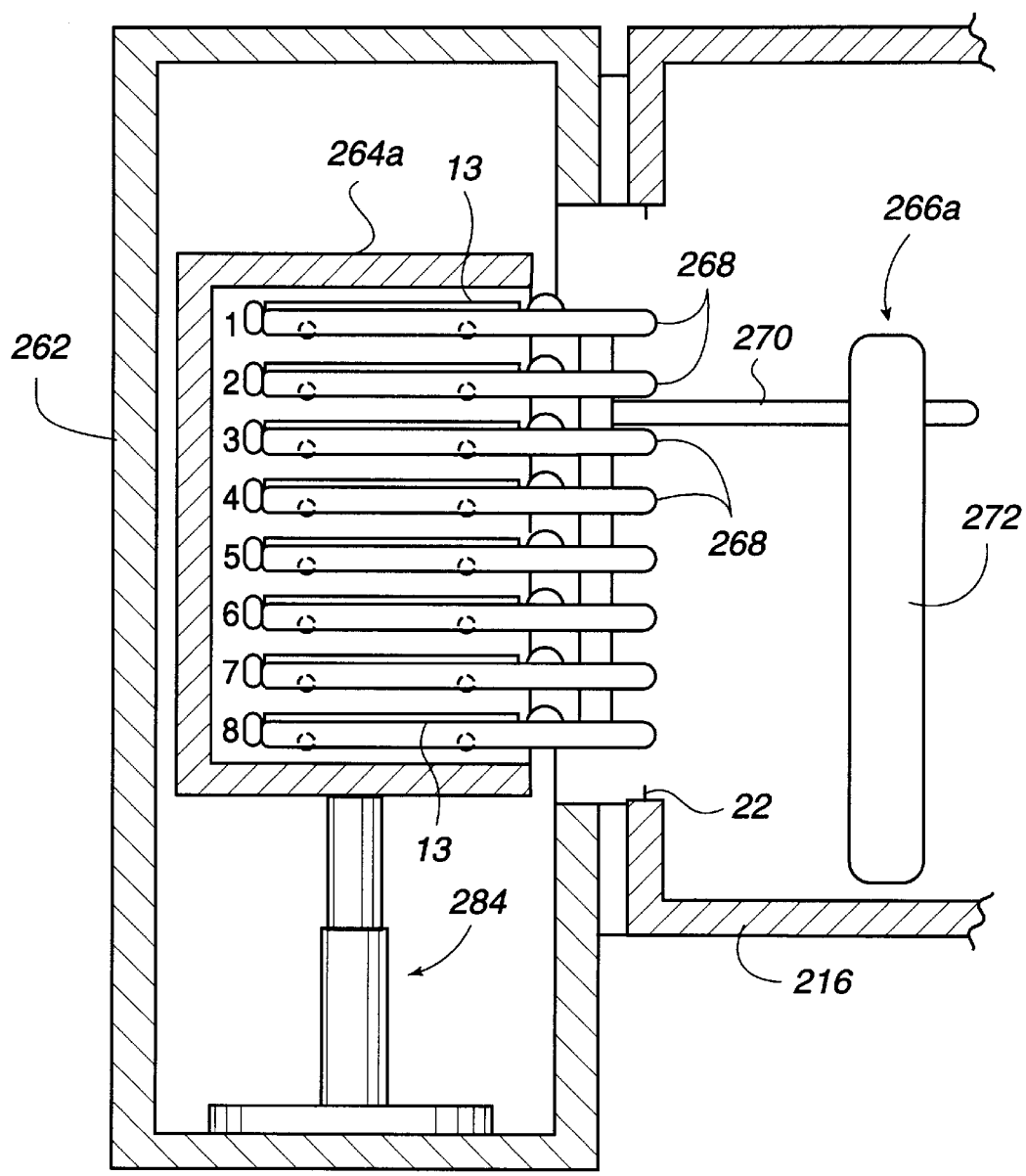
FIG. 6a is a partial cross-sectional view of the lot transfer robot and entry and central loadlock chambers of the system of FIG. 5.

The holding chamber 260 has a pair of wafer lot transfer robots 266a and 266b, each of which (as best seen in FIG. 6a) is capable of transferring at one time all of the wafers held by a cassette of the entry loadlock chamber. In other words, the wafer lot transfer robots 266a and 266b can each transfer one sublot (i.e., a portion of a lot) of wafers at a time from the entry loadlock chamber 262 to the holding chamber. The lot transfer robot 266a as shown in FIG. 6a has a plurality of parallel robot blades 268, one for each wafer of the sublot. The robot blades 268 are supported by a retractable arm 270 which permits the wafer sublot supported on the blades 268 to be withdrawn from the entry cassette 264a.

Figure 6B:
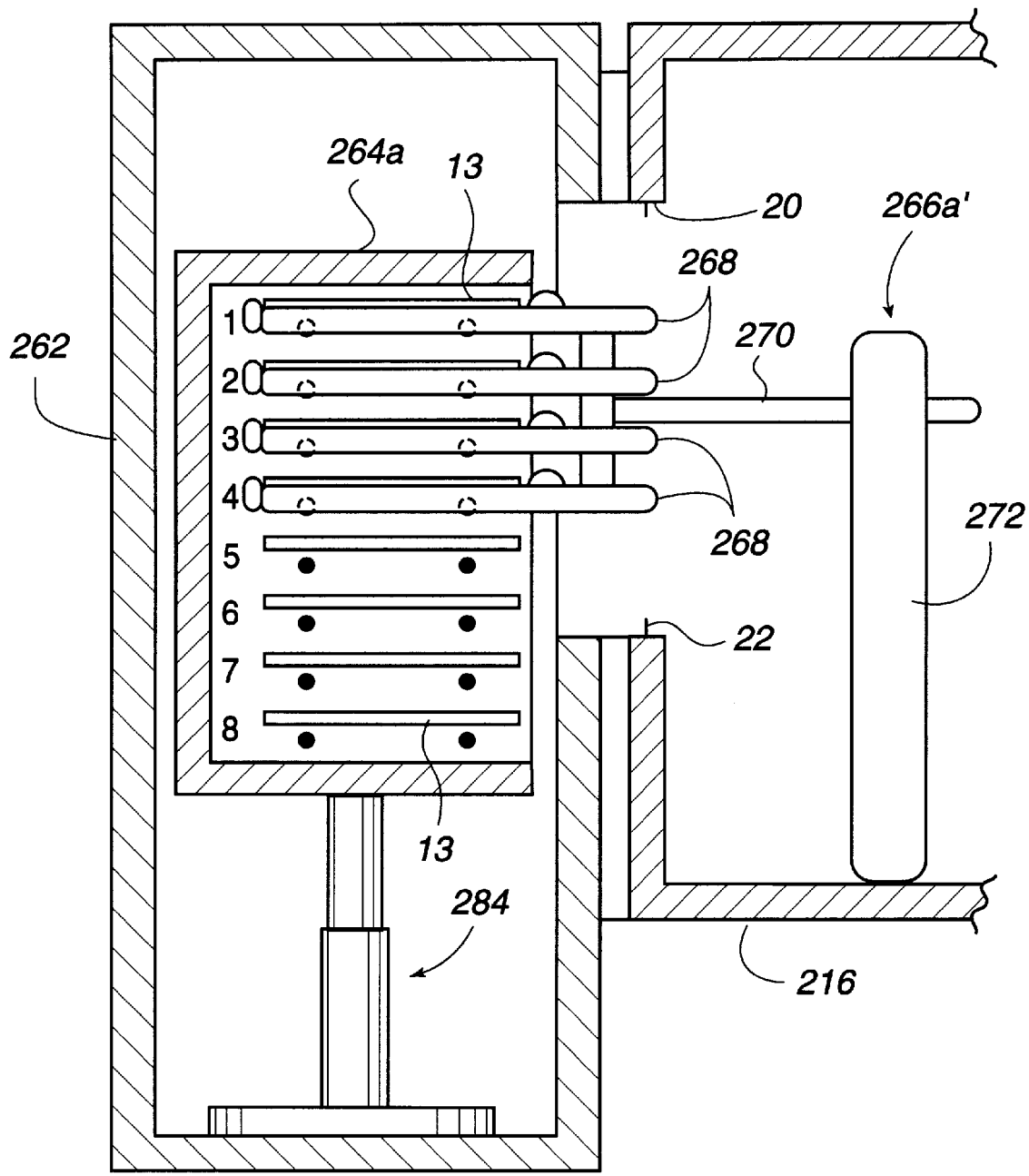
FIG. 6b is a partial cross-sectional view of alternative lot transfer robot and entry and central loadlock chambers.

The arm 270 is carried by a pivot post 272 which pivots the arm 270 (and blades 268 and wafer sublot) into the holding chamber 260. The lot transfer robot 266b is the mirror image of lot transfer robot 266a and operates in substantially the same manner in parallel with the lot transfer robot 266a to transfer two sublots of wafers from the entry cassettes, 264a and 264b simultaneously into the holding chamber 260. For purposes of illustration only, one sublot of wafers is shown in FIG. 6a as including eight wafers and each cassette is shown having a capacity of a single sublot of wafers at a time. Of course, the actual number of wafers in each sublot and the total capacity of each cassette and transfer robot may vary depending upon the particular application. For example, FIG. 6b shows an alternative embodiment in which the capacity of a cassette of the entry loadlock chamber includes more than one sublot of four wafers each. In this embodiment, the lot transfer robot 266a' transfers a sublot of four wafers at a time from the entry loadlock chamber to the holding chamber.

To remove a sublot of unprocessed wafers for processing, the entry cassettes 264a and 264b are elevated (either up or down) by an associated elevator 284 to position a sublot of wafers to be taken by the lot transfer robots 266a and 266b, respectively. Alternatively, the pivot post 272 of the lot transfer robots may be adapted to raise and lower the wafer blades 268 as needed to receive and deposit the wafers. (Yet another alternative is to provide a combination of vertical movements of both the robot blades and the cassettes as necessary to achieve transfers of wafers between robots and cassettes.) The two lot transfer robots 266a and 266b hold the two wafer sublots in position in the holding chamber 260 so that the mainframe transfer robot 214 can pick up two wafers, one from each sublot, from the two lot transfer robots 266a and 266b. The transfer robot 214 transfers the two wafers to the various processing stations coupled to the mainframe 216. Once processing is completed, the mainframe transfer robot 214 returns the two processed wafers to two empty blades of the lot transfer robots 266a and 266b, preferably the blades from which they were originally taken.

In the illustrated embodiment, the central holding chamber 260 is affixed to the periphery of the mainframe 216. The holding chamber 260 may be permanently joined to the mainframe, either in an integral one-piece construction, or welded or bolted to the mainframe 216. Alternatively the holding chamber may be removably attached to the mainframe with fasteners such as bolts, clamps and the like. In addition, a slit valve such as that indicated at 270 (in phantom), may be provided between the holding chamber 260 and the mainframe 216 to permit the holding chamber 260 to be operated at a different pressure than that of the mainframe 216, depending upon the particular application. For example, in some applications it may be desirable to vent the holding chamber 260 while vacuum pressure is maintained in the mainframe 216.

In accordance with another aspect of the present invention, once the processing of the two sublots has been completed and each of the processed wafers of the two sublots has been returned by the mainframe robot 214, the two lot transfer robots 266a and 266b transfer the two sublots of processed wafers to two separate exit loadlock chambers 280a and 280b, respectively, which are coupled to opposite ends of the holding chamber 260, instead of the mainframe 216. Each of the exit loadlock chambers 280a and 280b has a single cassette for holding a sublot of processed wafers whereas the entry loadlock chamber 262 has two cassettes in the illustrated embodiment. Of course, the roles of the entry and exit loadlock chambers could be reversed such that the unprocessed wafers are taken from the separate loadlock chambers 280a and 280b and the processed wafers are placed into the dual cassette loadlock chamber 262. Moreover, the roles of the loadlock chambers could be reversed frequently such as on a cassette by cassette or lot by lot basis.

When the entry cassettes of the entry chamber 262 have been fully unloaded by the lot transfer robots, a slit valve 290 between the entry chamber 262 and the holding chamber 260 may be closed to permit the entry chamber 262 to be vented while vacuum pressure is maintained in the holding chamber 260. After the pressure in the entry chamber 262 reaches ambient, slit valves 292a and 292b at each end of the entry chamber 262 are opened and additional unprocessed wafers are loaded into the two cassettes 264a and 264b of the entry chamber by a pair of atmospheric transfer robots 294a and 294b, respectively, through the slit valves 292a and 292b. The fresh unprocessed wafers are unloaded from external storage or stage cassettes 296a–296d positioned adjacent the robots 294a and 294b, respectively. The transfer robots 294a, 294b, may orient each wafer as it is transferred to the entry chamber.

In the same manner, when the exit cassettes 298a, 298b of the exit chamber 280a and 280b are filled to capacity with processed wafers, slit valves 300a and 300b between the exit chambers and the holding chamber 260 are closed to permit the exit chambers to be vented while vacuum pressure is maintained in the holding chamber 260. The processed wafers are unloaded from the exit chamber cassettes 298a, 298b through slit valves 302a, 302b by the atmospheric transfer robots 294a, 294b into the external storage cassettes 296a–296b, once the pressure in the exit chambers reaches ambient. Preferably, each processed wafer is returned to the same external storage cassette and the same slot of that cassette.

In a manner similar to that of the central holding chamber 260 and the mainframe 216, the entry and exit loadlock chambers may be permanently joined to the holding chamber 260, either in an integral one-piece construction, or welded or bolted to the chamber 260. Alternatively the entry and exit loadlock chambers may be removably attached to the holding chamber with fasteners such as bolts, clamps and the like.

In the illustrated embodiment, the cassettes 264a, 264b of the entry loadlock chamber 262 and the cassettes 298a, 298b of the exit loadlock chambers are open on two sides each to permit wafers to be loaded and unloaded from two orthogonal directions. In addition, these cassettes may be either permanently affixed to the associated loadlock chambers or alternatively may be removable to permit the cassettes to be replaced with cassettes of unprocessed wafers ready for unloading or empty cassettes ready to be loaded with processed wafers, as appropriate. If the cassettes are replaced manually through a loadlock door or other suitable access to the loadlock chamber, the atmospheric robots 294a, 294b may be eliminated.

As set forth above, it should be appreciated that the actual number of wafers in a lot or sublot will vary depending upon the particular application. For example, in many processing systems, there may be as many as 50 wafers in a lot. However, the capacity of cassettes will vary. For example, one often used external cassette has a total capacity of twenty-five wafers such that two full external cassettes comprise a lot.

The advantages of such an arrangement as described above are more readily appreciated by referring to FIGS. 7A and 7B which are which is a chart depicting the processing cycles for several sequential sublots of wafers using the lot transfer robots as depicted in FIG. 6a. In cycle 1, it is assumed that the system is at start up in which wafers have not yet entered the system. Thus, the initial conditions of the components of the system at the start of cycle 1 are that the cassettes of the exit loadlock chambers 280a and 280b are completely empty, the cassettes of the entry loadlock chamber 262 are completely full, the lot transfer robots 266a and 266b of the holding chamber 260 are empty and all of the processing chambers 240 of the mainframe are likewise empty.

Beginning cycle 1, two sublots of unprocessed wafers are unloaded from the entry chamber 262, one from each cassette 264a, 264b, by the lot transfer robots 266a, 266b of the central holding loadlock chamber 260. The two sublots of unprocessed wafers are positioned in the holding chamber 260 so that the mainframe transfer robot 214 can unload one wafer from each lot transfer robot for processing by the mainframe processing chambers 240. In the meantime, once the sublot of wafers is unloaded from each entry chamber cassette, these cassettes are empty and are available for refilling. In accordance with yet another aspect of the present invention, while the holding chamber 260 holds the first pair of sublots of wafers for processing by the mainframe system, the entry chamber 262, which is separate from the holding chamber 260, may be sealed from the holding chamber 260 by closing the slit valve 290. There is no need for the entry chamber to be accessed by the system at this time because unprocessed wafers are taken from the holding chamber for processing and are returned to the holding chamber once processing of each pair of wafers is completed. As a consequence, the entry chamber 262 may be vented, reloaded with two more sublots of unprocessed wafers (one sublot in each cassette) from the external storage cassettes 296a–296b while the processing of the first pair of sublots continues between the mainframe system and the holding chamber 260. Depending upon the number and type of the particular processes and the number of wafers in each sublot, it is anticipated that the entry chamber can be vented, reloaded and pumped down again before the processing of the second pair of sublots is completed such that the entry chamber is ready to provide additional unprocessed wafers by the end of cycle 1. As a consequence, for many applications, throughput may not be adversely affected by the need to reload the entry chamber. Once all the wafers have been processed and returned to the lot transfer robots 266a, 266b, cycle 1 is completed.

At the beginning of cycle 2, the two sublots of processed wafers are loaded by the lot transfer robots 266a, 266b into the two cassettes of the two exit chambers 280a, 280b. The two lot transfer robots then return to the entry chamber 262 to pick up two more sublets of unprocessed wafers. Once the cassettes of the entry chamber 262 are empty, the entry chamber 262 may be vented and reloaded with another sublot of processed wafers as described above in connection with cycle 1.

Furthermore, once the first sublot of processed wafers is loaded into each exit chamber cassette, these cassettes are full and are ready to be unloaded. In the same manner that the entry chamber is vented and reloaded while the holding chamber 260 supplies unprocessed wafers from the second pair of sublots of wafers to the mainframe system and receives processed wafers back from the mainframe system, the exit chambers 280a, 280b, which are separate from the holding chamber 260, may be sealed from the holding chamber 260 by closing the slit valves 300a, 300b. Again, there is no need for the exit chambers to be accessed by the system at this time because unprocessed wafers are taken from the holding chamber for processing and are returned to the holding chamber once processing of each pair of wafers is completed. As a consequence, the exit chambers 280a, 280b may be vented, two sublots of processed wafers (one sublot from each cassette) unloaded by the robots 294a, 294b, into the two storage cassettes 296a–296b, and the exit chambers pumped down again while the processing of the second pair of sublots continues between the mainframe system and the holding chamber 260. Thus, for many applications, throughput may not be adversely affected by the need to unload the exit chambers.

Once the second pair of sublots of wafers has been processed and returned to the lot transfer robots 266a, 266b, cycle 2 is completed.

The next cycle, cycle 3 is performed substantially the same as cycle 2. Cycle 4 is performed substantially the same as cycle 3 and so on. In this manner, the venting, loading/unloading and pumping down operation of the entry and exit loadlock chambers may be performed substantially in parallel. Of course, if the capacity of the cassettes includes more than two sublots of wafers each, the number of cycles between successive venting and pumping down operations may be increased accordingly for each loadlock chamber.

It is seen from the above that a wafer handling system in accordance with the present invention facilitates processing two sublots of wafers at a time without requiring a substantial increase in the periphery of the mainframe occupied by loadlock chambers. Two sublots of unprocessed wafers may be brought into a holding chamber at a time, processed by the mainframe system and deposited in one or more exit loadlock chambers in a wafer handling system which occupies the mainframe peripheral space of a single dual cassette loadlock chamber. Moreover, loadlock chambers coupled to the holding chamber may be vented, loaded or unloaded and pumped down again without interrupting the processing of wafer sublots.

FIGS. 8A and 8B are a chart directed to another embodiment. FIGS. 8A and 8B depict the processing cycles for a system having entry and exit loadlock chamber cassettes having a capacity of more than one sublot at a time. In this example, the cassettes 264a, 264b have a capacity of two sublots, of four wafers each, as shown in FIG. 6b.

Cycle 1 of the process of FIGS. 8A and 8B is similar to the process of FIGS. 7A and 7B except that after the first pair of sublots is unloaded from the entry loadlock chambers, the entry loadlock chamber is not vented and unloaded because additional sublots remain to be subsequently unloaded in the next cycle. Once all the wafers of the first pair of sublots have been processed and returned to the lot transfer robots 266a, 266b, cycle 1 is completed.

At the beginning of cycle 2, the first pair of sublots of processed wafers are loaded by the lot transfer robots 266a, 266b into the two cassettes of the two exit chambers 280a, 280b. The two lot transfer robots then return to the entry chamber 262 to pick up two more lots of unprocessed wafers. Again, once these wafers have been processed and returned to the lot transfer robots 266a, 266b, cycle 2 is completed. However, in the example of FIGS. 8A and 8B, it has been assumed for purposes of simplicity that the capacity of the cassettes of the entry chamber 262 is limited to two sublots of unprocessed wafers each. Thus, once the second sublot of wafers is unloaded from each entry chamber cassette, these cassettes are empty and are now available for refilling. As a consequence, the entry chamber 262 may be vented, reloaded with four more sublots of unprocessed wafers (two sublots in each cassette) while the processing of the second pair of sublots continues between the mainframe system and the holding chamber 260.

Cycle 3 is similar to cycle 2 except that, again, in the example of FIGS. 8A and 8B, it has been assumed for purposes of simplicity that the capacity of the cassettes of the exit chambers 280a, 280b is limited to two sublots of processed wafers each. As a consequence, once the second sublot of processed wafers is loaded into each exit chamber cassette, these cassettes are full and are ready to be unloaded. Thus, while the holding chamber 260 supplies unprocessed wafers from the third pair of sublots of wafers to the mainframe system and receives processed wafers back from the mainframe system, the exit chambers 280a, 280b, which are separate from the holding chamber 260, may be sealed from the holding chamber 260 by closing the slit valves 300a, 300b. Again, there is no need for the exit chambers to be accessed by the system at this time because unprocessed wafers are taken from the holding chamber for processing and are returned to the holding chamber once processing of each pair of wafers is completed. As a consequence, the exit chambers 280a, 280b may be vented, four sublots of processed wafers (two sublots from each cassette) unloaded by the robots 294a, 294b, into the four external storage cassettes 296a–296d, and the exit chambers pumped down again while the processing of the third pair of sublots continues between the mainframe system and the holding chamber 260.

The next cycle, cycle 4 is performed substantially the same as cycle 2. Cycle 5 is performed substantially the same as cycle 3. In this manner, the venting, loading/unloading and pumping down operation of the loadlock chambers alternates between the entry and exit loadlock chambers. Of course, if the capacity of the cassettes includes more than two sublots of wafers each, the number of cycles between successive venting and pumping down operations may be increased accordingly for each loadlock chamber.

FIGS. 9A and 9B is directed to yet another embodiment, in which the roles of the loadlock chambers are not fixed as either entry or exit chambers but instead alternate between these two roles each cycle. Thus, in cycle 1, loadlock chamber A which may be the chambers 298a and 298b for example, contains processed wafers and is vented and unloaded. However, in the embodiment of FIGS. 9A and 9B, unprocessed wafers are then loaded into the same chamber 298a and 298b for subsequent processing. During the same cycle 1, unprocessed sublots are unloaded from loadlock chamber B which may be the chamber 262 of FIG. 5 for example, and are processed.

During the next cycle 2, entry and exit roles of the loadlock chambers switch as the wafers processed in cycle 1 are returned to the same loadlock chamber, here, chamber B or chamber 262, from which they were unloaded. Then, the unprocessed wafers are unloaded from loadlock chamber A (loadlock chambers 280a, 280b) and are processed. Meanwhile, loadlock chamber B is vented and the processed wafers are unloaded from loadlock chamber B.

The roles of the loadlock chambers switch again in the next cycle, cycle 3 in which the processed wafers are returned to loadlock chamber A which is then vented and unloaded. At the same time, unprocessed wafers are unloaded from loadlock chamber B for processing during cycle 3. During the subsequent cycle 4, the roles of the loadlock chambers switch again.

It will, of course, be understood that modifications of the present invention, in its various aspects, will be apparent to those skilled in the art, some being apparent only after study others being matters of routine mechanical and electronic design. For example, Other embodiments are also possible, their specific designs depending upon the particular application. As such, the scope of the invention should not be limited by the particular embodiments herein described but should be defined only by the appended claims and equivalents thereof.

What is claimed is:

1. A method of processing semiconductor workpieces, comprising:

loading processed workpieces from a stack for workpieces in an evacuated holding chamber into a first cassette in an evacuated first chamber;

unloading unprocessed workpieces from a second cassette in an evacuated second chamber into a stack for workpieces in said holding chamber;

sealing said second chamber from said holding chamber;

venting said second chamber after said second chamber is sealed from said holding chamber; and removing workpieces from said holding chamber and processing said removed workpieces while said second chamber is vented.

2. The method of claim 1 further comprising loading unprocessed workpieces into said second cassette of said second chamber after said second chamber is vented.

3. The method of claim 2 further comprising pumping down said second chamber after unprocessed workpieces are loaded into said second cassette.

4. The method of claim 1 further comprising:

sealing said holding chamber from said holding chamber;

venting said first chamber after said first chamber is sealed from said holding chamber;

removing workpieces from said holding chamber and processing said removed workpieces while said first chamber is vented.

5. The method of claim 4 further comprising unloading processed workpieces from said first chamber after said first chamber is vented.

6. The method of claim 5 further comprising pumping down said first chamber after processed workpieces have been unloaded from said first chamber.

7. The method of claim 1 wherein said holding chamber has two stacks of unprocessed workpieces and said processing comprises taking two workpieces from said holding chamber stacks of unprocessed workpieces, processing said two workpieces in at least two processing chambers to turn said two workpieces into two processed workpieces and returning said two processed workpieces to said holding chamber stacks.

8. A method of processing semiconductor workpieces, comprising:

unloading at least two groups of unprocessed workpieces into an evacuated holding chamber from at least two cassettes in at least one first evacuated chamber;

processing at least two groups of unprocessed workpieces by:

removing two unprocessed workpieces at a time from said holding chamber;

processing said two removed workpieces in a mainframe system into two processed workpieces; and returning said two processed workpieces to said holding chamber;

loading at least two groups of processed workpieces from said holding chamber into at least two cassettes in at least one second evacuated chamber;

sealing said first chamber from said holding chamber;

venting said first chamber after said first chamber is sealed from said holding chamber;

loading at least two groups of unprocessed workpieces into cassettes of said first chamber after said first chamber is vented;

pumping down said first chamber after unprocessed workpieces are loaded into said first cassettes;

sealing said second chamber from said holding chamber;

venting said second chamber after said second chamber is sealed from said holding chamber;

pumping down said second chamber after processed workpieces have been unloaded from said second chamber; and processing workpieces from said holding chamber while said second chamber is vented.

9. A semiconductor workpiece processing system, comprising:

a mainframe chamber having a plurality of processing chambers coupled to said mainframe chamber;

a vacuum holding chamber coupled to said mainframe chamber for holding a lot of workpieces;

a first vacuum cassette chamber having a first cassette and coupled to said holding chamber; and a lot transfer robot for transferring a lot of workpieces simultaneously from said cassette chamber to said holding chamber to be held for subsequent transfer to said mainframe chamber.

10. A semiconductor workpiece processing system, comprising:

a mainframe chamber having a plurality of processing chambers coupled to said mainframe chamber;

a vacuum holding chamber coupled to said mainframe chamber for holding a lot of workpieces;

an entry chamber having an entry cassette and coupled to said holding chamber;

an exit chamber having an exit cassette and coupled to said holding chamber; and means for 1) in a first cycle, a) transferring processed workpieces from said holding chamber to said exit cassette; b) transferring unprocessed workpieces from said entry cassette to said holding chamber; c) sealing said entry chamber from said holding chamber; d) venting said entry chamber after said entry chamber is sealed from said holding chamber; e) processing workpieces in said holding chamber while said entry chamber is vented; f) loading unprocessed workpieces into said entry cassette of said entry chamber after said entry chamber is vented; g) pumping down said entry chamber after unprocessed workpieces are loaded into said entry cassette; and 2) in a second cycle, a) transferring processed workpieces from said holding chamber to said exit cassette; b) transferring unprocessed workpieces from said entry cassette to said holding chamber; c) sealing said exit chamber from said holding chamber; d) venting said exit chamber after said exit chamber is sealed from said holding chamber; e) processing workpieces in said holding chamber while said exit chamber is vented; unloading processed workpieces from said exit cassette of said exit chamber after said exit chamber is vented; and g) pumping down said exit chamber after processed workpieces have been unloaded from said exit chamber; and 3) cyclicly repeating said first and second cycles.

11. A method of processing semiconductor workpieces comprising:

1) in a first cycle, a) transferring processed workpieces from an evacuated holding chamber to first and second cassettes in at least one evacuated exit chamber; b) transferring unprocessed workpieces from third and fourth cassettes in at least one evacuated entry chamber to said holding chamber; c) sealing said at least one entry chamber from said holding chamber; d) venting said at least one entry chamber after said at least one entry chamber is sealed from said holding chamber; e) processing workpieces in said holding chamber while said at least one entry chamber is vented; f) loading unprocessed workpieces into said third and fourth cassettes of said at least one entry chamber after said at least one entry chamber is vented; and g) pumping down said at least one entry chamber after unprocessed workpieces are loaded into said third and fourth cassettes;

2) in a second cycle, a) transferring processed workpieces from said holding chamber to said first and second cassettes; b) transferring unprocessed workpieces from said third and fourth cassettes to said holding chamber; c) sealing said at least one exit chamber from said holding chamber; d) venting said at least one exit chamber after said at least one exit chamber is sealed from said holding chamber; e) processing workpieces in said holding chamber while said at least one exit chamber is vented; f) unloading processed workpieces from said first and second cassettes of said at least one exit chamber after said at least one exit chamber is vented; and g) pumping down said at least one exit chamber after processed workpieces have been unloaded from said at least one exit chamber; and 3) cyclicly repeating said first and second cycles.

12. The method of claim 1 wherein said loading of workpieces is performed using a transfer robot stationed within said holding chamber and having said stack which comprises a plurality of parallel blades positioned to hold workpieces in a stacked formation and adapted to transfer stacked workpieces simultaneously from said holding chamber to said first cassette in said first chamber.

13. The method of claim 12 wherein said unloading of workpieces is performed using said transfer robot.

14. A method of processing semiconductor workpieces, comprising:

loading processed workpieces from a stack for workpieces in an evacuated holding chamber into a first cassette in an evacuated first chamber;

unloading unprocessed workpieces from a second cassette in an evacuated second chamber into a stack for workpieces in said holding chamber;

sealing said second chamber from said holding chamber;

venting said second chamber after said second chamber is sealed from said holding chamber;

removing workpieces from said holding chamber and processing said removed workpieces while said second chamber is vented; and unloading unprocessed workpieces from a third cassette in an evacuated chamber into a second stack for workpieces in said holding chamber.

15. The method of claim 14 wherein said unloadings of workpieces from said second and third cassettes into said first and second stacks, respectively, in said holding chamber occur at the same time.

16. The method of claim 14 further comprising loading processed workpieces from said second stack to a fourth cassette in an evacuated chamber.

17. The method of claim 16 wherein said loadings of workpieces into said first and fourth cassettes from said first and second stacks, respectively, occur at the same time.

18. The method of claim 14 further comprising processing at least two stacks of unprocessed workpieces in said holding chamber by:

removing two unprocessed workpieces at a time from said first and second stacks, respectively, in said holding chamber;

processing said two removed workpieces in a mainframe system into two processed workpieces; and returning said two processed workpieces at a time to said first and second stacks, respectively, in said holding chamber.

19. The method of claim 1 wherein said processed workpieces loaded into said first cassette were previously unloaded as unprocessed wafers from said second cassette.

* * * * *